(12) United States Patent
Aggarwal et al.

(10) Patent No.: US 7,725,012 B2
(45) Date of Patent: May 25, 2010

(54) MOVABLE RADIANT HEAT SOURCES

(75) Inventors: Ravinder Aggarwal, Gilbert, AZ (US); Jeroen Stoutjesdijk, Bussum (NL)

(73) Assignee: ASM America, Inc., Phoenix, AZ (US)

(*) Notice: Subject to any disclaimer, the term of this patent is extended or adjusted under 35 U.S.C. 154(b) by 575 days.

(21) Appl. No.: 11/655,556

(22) Filed: Jan. 19, 2007

(65) Prior Publication Data

US 2008/0175571 A1 Jul. 24, 2008

(51) Int. Cl.
*A21B 2/00* (2006.01)
*C23C 16/00* (2006.01)

(52) U.S. Cl. .................................. 392/416; 118/725
(58) Field of Classification Search ......... 392/407–440; 118/724, 725
See application file for complete search history.

(56) References Cited

U.S. PATENT DOCUMENTS

| | | | | |
|---|---|---|---|---|
| 3,626,152 A | * | 12/1971 | Governale et al. | 392/416 |
| 3,833,975 A | * | 9/1974 | Cahnman et al. | 28/281 |
| 4,563,572 A | * | 1/1986 | Hager, Jr. | 392/423 |
| 4,728,777 A | | 3/1988 | Tsisios et al. | |
| 5,029,231 A | * | 7/1991 | Carr et al. | 392/435 |
| 5,332,442 A | | 7/1994 | Kubodera et al. | |
| 5,336,866 A | * | 8/1994 | Winstead et al. | 219/411 |
| 6,167,195 A | | 12/2000 | Moslehi et al. | |
| 6,259,061 B1 | | 7/2001 | Osawa | |
| 6,448,536 B2 | | 9/2002 | Li et al. | |
| 6,554,905 B1 | | 4/2003 | Goodwin | |
| 6,876,816 B2 | | 4/2005 | Shigeoka et al. | |

* cited by examiner

*Primary Examiner*—Daniel L Robinson
(74) *Attorney, Agent, or Firm*—Knobbe Martens Olson & Bear LLP

(57) ABSTRACT

A semiconductor processing apparatus including a processing chamber and a plurality of radiant heat sources. The radiant heat sources heat a workpiece within the chamber. At least one of the radiant heat sources is movable during processing in an oscillatory motion along a path less than about 10 mm from a geometric center of the oscillatory motion.

32 Claims, 8 Drawing Sheets

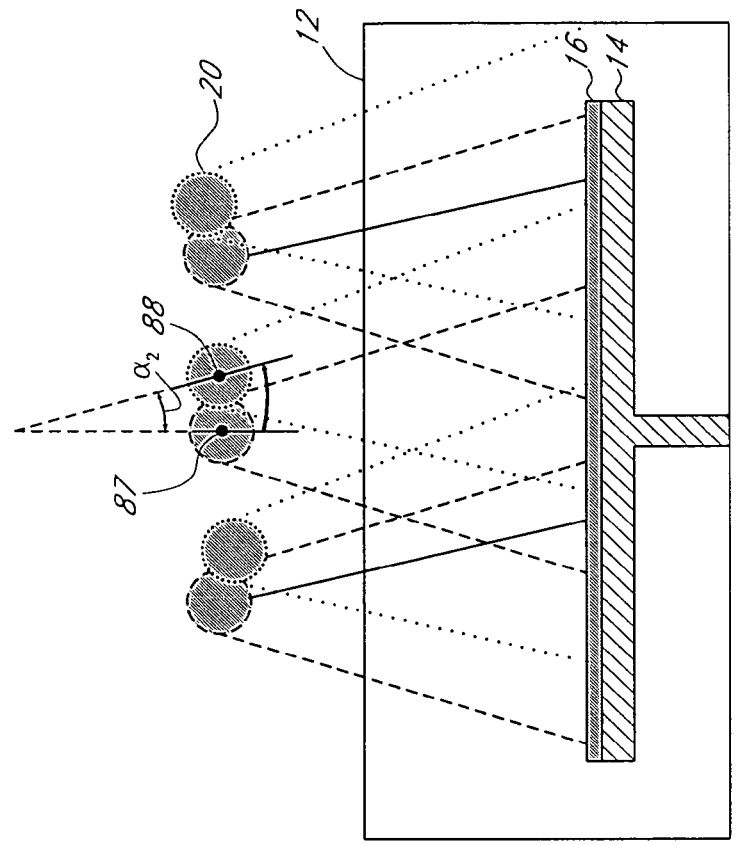
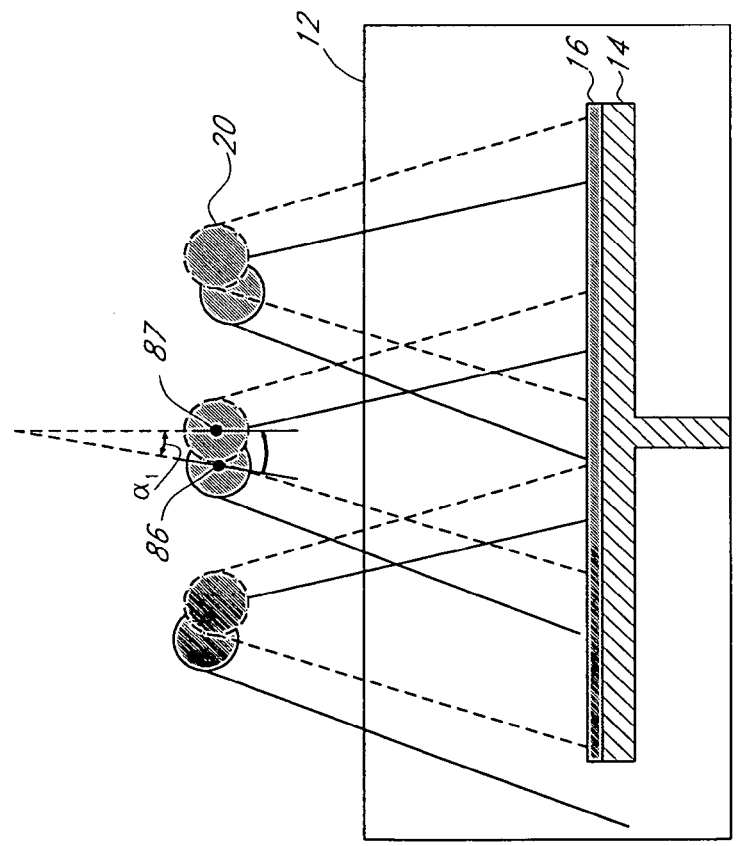

MOVABLE RADIANT HEAT SOURCES

BACKGROUND OF THE INVENTION

1. Field of the Invention

The invention generally relates to heating systems for semiconductor manufacturing equipment. More specifically, the invention relates to radiant heat sources for improving temperature uniformity.

2. Description of the Related Art

Chemical vapor deposition (CVD) is a very well known process in the semiconductor industry for forming thin films of materials on wafers. In a CVD process, gaseous molecules of the material to be deposited are supplied to wafers to form a thin film of that material on the wafers by chemical reaction. Such formed thin films may be polycrystalline, amorphous, or epitaxial. Typically, CVD processes are conducted at elevated temperatures in order to accelerate the chemical reaction.

In the semiconductor industry, it is important that the material be deposited with uniform properties, such as thickness and composition, over the wafer. In Very Large and Ultra Large Scale Integrated Circuit (VLSI and ULSI) technologies, the wafer is divided into individual chips having integrated circuits thereon. If a CVD process step produces deposited layers with non-uniformities, devices at different areas on the wafer and even devices within the chips may have inconsistent operation characteristics, or may fail altogether.

Various process parameters must be carefully controlled to ensure the high uniformity of the resulting layers. One such parameter is the temperature of the wafer or other substrate during certain steps. During CVD, for example, the deposition gases react at particular temperatures and deposit on the wafer. If the temperature varies across the surface of the substrate, uneven deposition of the reactant gas occurs and the thickness and resistivity will not be uniform. Other fabrication techniques, such as etching and annealing, also depend upon uniform temperature distribution across the substrate (s). Accordingly, it is desirable that temperature be uniform across the substrate.

Substrates can be heated using resistance heating, induction heating, or radiant heating. Among these, radiant heating is currently the favored method of supplying heat energy to a wafer in a single wafer processing chamber. Significantly, radiant heating results in short processing times and high throughput because the temperature of the wafers can be ramped up to the desired process temperature and ramped down to a satisfactory handling temperature faster than with the alternative heating techniques. Additionally, radiant heating can be controlled to maintain the wafer at the desired temperature for a sufficient duration to accomplish the process. Radiant heating energy can be supplied, for example, by banks of infrared (IR) lamps (e.g., quartz halogen lamps) above and/or below the wafer in the reaction chamber.

Radiant energy has a tendency to create non-uniform temperature distributions, including areas of less intensity (or shadows or "cold spots") and areas of more intensity (or "hot spots") due to the use of localized lamps and the consequent focusing and interference effects. In an effort to provide more uniform heat source distribution and a resulting uniform temperature distribution across the wafers, the industry practice has been to mount reflectors behind the bulbs to reflect the energy from the bulbs and direct the same onto the wafers. These reflectors are generally made of a base metal and are plated to efficiently reflect the light energy. However, radiant heat sources still tend to induce hot and cold spots on wafers being heated.

Temperature non-uniformities may be somewhat reduced by rotating the wafer during processing. Continuous rotation about a vertical axis about perpendicular to the wafer moves regions of the wafer that would otherwise reside within shadows or hot spots to distribute temperatures on the wafer surface somewhat more uniformly. Temperature non-uniformities may also be somewhat reduced by continuously rotating the reflector about a vertical axis as disclosed in U.S. Pat. No. 6,554,905. However, it has been found that temperature uniformity suffers even with this continual rotation of the wafer or the reflector bank about a vertical axis. Specifically, hot and cold spots remain in the form of rings at particular radial distances from the center, or in regions on the wafer surface.

SUMMARY OF THE INVENTION

In certain embodiments, a semiconductor processing apparatus comprises a processing chamber and a plurality of radiant heat sources to heat a workpiece within the chamber. At least one of the radiant heat sources is movable during processing in an oscillatory motion along a path less than about 10 mm from a geometric center of the oscillatory motion.

In certain embodiments, a semiconductor processing apparatus comprises a processing chamber and a plurality of radiant heat sources to illuminate a first area on a workpiece within the chamber. At least one of the radiant heat sources is movable in a motion during processing from a first angular position to a second angular position to illuminate a second area on the workpiece. A ratio of the second area to the first area is less than about 10%.

In certain embodiments, a method of processing a semiconductor workpiece comprises providing a processing chamber, loading the workpiece into the chamber, heating the workpiece with a plurality of radiant heat sources, and moving at least one of the radiant heat sources in an oscillatory motion along a path. The motion less is than about 10 mm from a geometric center of the oscillatory motion.

In certain embodiments, a method of processing a workpiece in a semiconductor processing apparatus comprises providing a processing chamber, loading the workpiece into the chamber, heating the workpiece with a plurality of radiant heat sources, each of the radiant heat sources illuminating a first area on the workpiece, and moving at least one of the radiant heat sources in an oscillatory motion along a path. The radiant heat sources illuminate a second area on the workpiece. A ratio of the second area to the first area is less than about 10%.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

These and other features, aspects, and advantages of the invention disclosed herein are described below with reference to the drawings of preferred embodiments, which are intended to illustrate and not to limit the invention. The drawings comprise nine figures in which:

FIGS. 4A through 4C are schematic side views of yet another embodiment of the motion of the movable radiation device of FIG. 1.

DETAILED DESCRIPTION OF THE PREFERRED EMBODIMENTS

Although certain preferred embodiments and examples are disclosed below, it will be understood by those in the art that the invention extends beyond the specifically disclosed embodiments and/or uses of the invention and obvious modifications and equivalents thereof. Thus, it is intended that the scope of the invention herein disclosed should not be limited by the particular disclosed embodiments described below.

Figure 1:
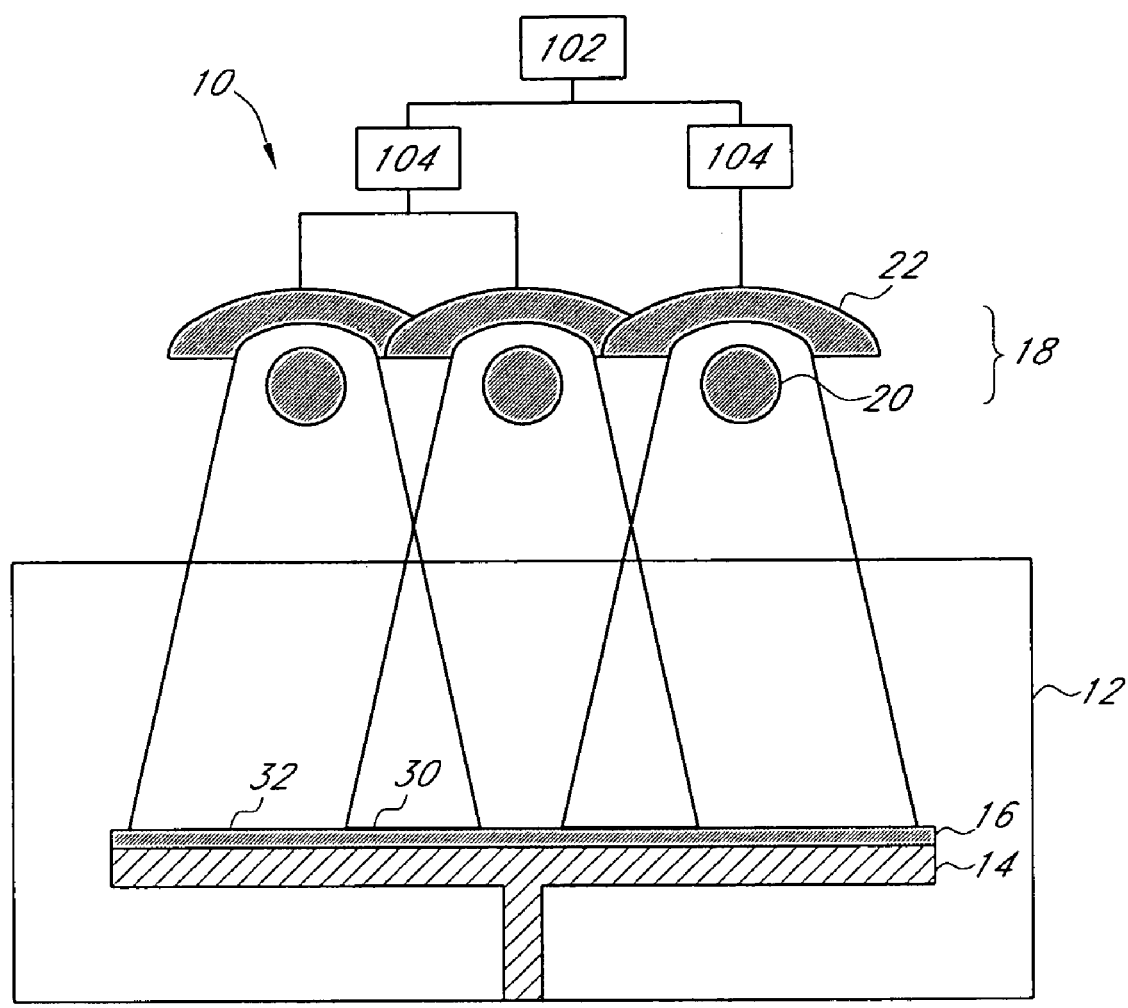
FIG. 1 is a schematic side view of an apparatus with movable radiant heat sources.
Figure 1:
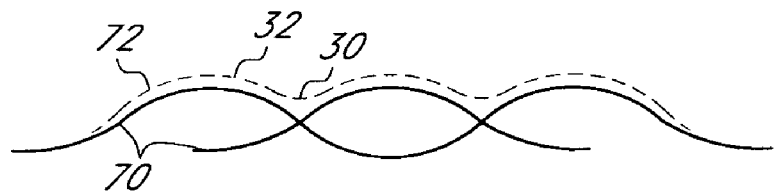

FIG. 1 is a schematic side view of one example of a semiconductor processing apparatus 10 with a movable radiation device. The apparatus 10 comprises a process chamber 12, a support structure 14 within the chamber 12 configured for supporting a workpiece 16, and a plurality of radiant heat sources. The radiant heat sources may comprise bulbs 20, reflectors 22, or a lamp 18, which is a combination of a bulb 20 and a reflector 22. A plurality of heat sources may be referred to as an array or a bank (e.g., a lamp bank comprises a plurality of lamps 18). The radiant heat sources are either individually or collectively movable in an oscillatory motion relative to the workpiece 16. The apparatus 10 may further comprise a controller 102 for controlling the movement at least one motor 104 that generates motion of at least one of the plurality of radiant heat sources. The apparatus 10 may comprise individual motors 104 for each radiant heat source (e.g., as indicated by the right radiant heat source in FIG. 1), motors for each array of radiant heat sources (e.g., as illustrated by the left two radiant heat sources in FIG. 1), or one motor for the entire bank of radiant heat sources. The apparatus 10 preferably comprises one controller 102 that can control the movement of all of the motors 104.

In the embodiment of the apparatus 10 illustrated in FIG. 1, chamber 12 is a cold wall, single wafer chemical vapor deposition (CVD) chamber. However, the chamber 12 may be any semiconductor processing chamber in which uniformity of temperature from radiant heating sources is desired, for example atomic layer deposition (ALD), dry etch, oxidation, nitridation, anneal, etc. Typically, the chamber 12 is formed of quartz, which can remain relatively cold as radiant energy from the radiant heat sources passes through the walls to be absorbed by the workpiece 16 and the support structure 14.

The support structure 14 may be any structure suitable for holding a workpiece 16, for example a susceptor or a vacuum chuck. Preferably, the support structure 14 material absorbs radiant heat to help heat the workpiece 16 such that the support structure 14 acts as a susceptor. In some embodiments, the support structure 14 is adapted to rotate the workpiece 16 during processing. In certain embodiments, the apparatus 10 comprises a robot (not shown) for inserting and removing the workpiece 16 from the chamber 12. The support structure 14 may be adapted to receive a workpiece 16 from the robot, for example with cutouts to accept an end effector of a Bernoulli wand or lift pins.

The workpiece 16 may be any material suitable for processing in the apparatus 10. In one embodiment, the workpiece 16 is a semiconductor substrate. The diameter of the workpiece 16 is preferably between about 50 mm and 300 mm. In certain embodiments, the workpiece 16 includes a plurality of patterned layers, such as dielectric layers, conductive layers, and semiconductive layers.

The plurality of radiant heat sources is preferably disposed above and below the workpiece 16. In some embodiments, the plurality of radiant heat sources is disposed only above the workpiece 16 (e.g., as depicted in FIG. 1) or only below the workpiece 16. In certain embodiments, the plurality of radiant heat sources comprises a plurality of bulbs 20 and reflectors 22 disposed on the side of bulbs 20 substantially opposite the workpiece 16. Together, the plurality of radiant heat sources may be referred to as a "lamp bank" or a "lamp array." The bulbs 20 are preferably tubular halogen quartz or tungsten filament lamps that are longer than the diameter of the workpiece 16 and/or focused "spot lamps." In embodiments in which the bulbs 20 are disposed above and below the workpiece 16, the tubes above the workpiece 16 are preferably about perpendicular to the tubes below the workpiece 16. Several preferred arrangements for radiant heat sources are disclosed in U.S. Pat. Nos. 6,021,152 and 6,465,761, each incorporated herein by reference in its entirety. As disclosed therein, the radiant heat sources can include lower spot lamps (not shown) designed to compensate for the heat-sink effect of the support structures that extend downwardly out of the chamber 12. The disclosed Figures are schematic only and are greatly simplified for illustration purposes, and the relative sizes and positions of the components may vary.

The reflectors 22 are configured to direct light energy onto the workpiece 16 and/or the support structure 14. In some embodiments, the plurality of radiant heat sources comprises a plurality of bulbs 20 and a single reflector plate disposed on the side of the bulbs 20 substantially opposite the workpiece 16. The reflector plate may be adapted to diffusively direct or "focus" the light directed from the plurality of bulbs 20 onto the workpiece 16, for example with radial grooves. In some embodiments, the plurality of radiant heat sources comprises a plurality of reflector plates not affixed to a particular bulb 20 or all of the bulbs 20.

In embodiments comprising a plurality of bulbs 20, light may be directed onto the workpiece 16 by each bulb 20 in a Gaussian intensity profile due to the inverse square relationship between intensity and distance, for example as depicted by the intensity profiles 70. The intensity profiles 70 preferably overlap, as illustrated by cumulative intensity profile 72, but more intense areas (or "hot spots") 32 and less intense areas (or "cold spots") 30 will remain. The less intense areas 30 indicate that the light, and thus the radiant energy, transmitted onto the workpiece 16 by the plurality of bulbs 20 is not uniform across the wafer, which may result in process non-uniformity as described above. Similar intensity differences are created by other configurations of radiant heat sources (e.g., lamps 18 and reflectors 22).

In a preferred embodiment of the present invention, small movements of the plurality of radiant heat sources in an oscillatory motion can decrease the effects of the intensity differences by blurring the edges of the hot and/or cold spots, such as the less intense areas 30. In some embodiments, the oscillatory motion is along a path less than about 10 millimeters from the geometric center of the oscillatory motion. In some embodiments, the oscillatory motion is along a path less than about 5 millimeters from the geometric center of the oscillatory motion. The lower limit of the oscillatory motion is greater than zero millimeters. In some embodiments, the magnitude of the oscillatory motion is defined by an angle of oscillation about an axis or a ratio of constantly illuminated and periodically illuminated areas, as discussed below.

Figure 2:
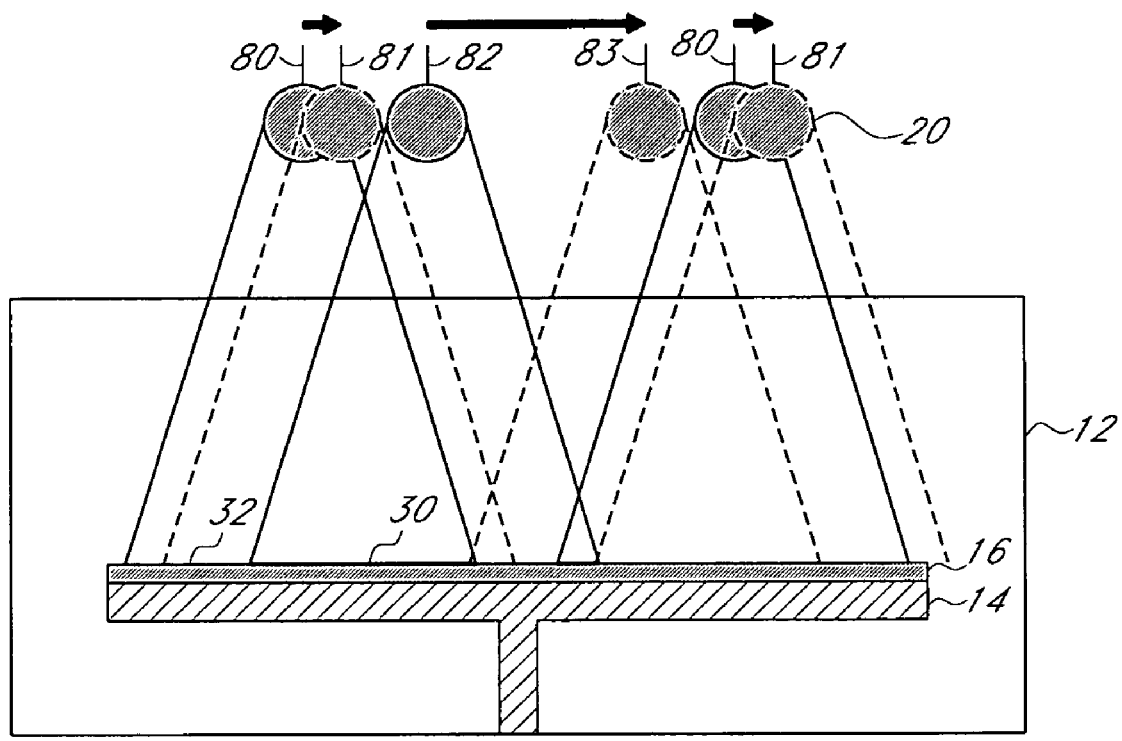
FIG. 2 is a schematic side view of an embodiment of the motion of the movable radiation device of FIG. 1.
Figure 2:

In certain embodiments, the radiant heat sources move jointly in arrays (e.g., as illustrated in FIGS. 3, 4A, 4B, 5A, and 5B). As used herein, the term "array" is to be given its broadest ordinary meaning including, but not limited to, a group of elements forming a unit. Specifically, an array of radiant heat sources may be any number of radiant heat sources, up to and including all of the radiant heat sources in the plurality of radiant heat sources. In other embodiments, the radiant heat sources each move independently of one another (e.g., as illustrated in FIG. 2). Specifically, when radiant heat sources (i.e., lamps 18, bulbs 20, or reflectors 22) are referred to as moving "independently," the movement of one element is not mechanically linked and identical to the movement of another element, although two elements may have similar movement. For example, adjacent bulbs 20 may move along a horizontal path in the same direction and distance, but the movement mechanism is not shared between them.

In certain embodiments in which the plurality of radiant heat sources comprises a plurality of lamps 18, the lamps 18 move jointly in arrays. In some embodiments, the lamps 18 each move independently. In other embodiments, only some of the lamps 18 move jointly in arrays or independently (e.g., some of the lamps 18 remain stationary). In certain embodiments in which the plurality of radiant heat sources is a plurality of bulbs 20, the bulbs 20 move jointly in arrays. In some embodiments, the bulbs 20 each move independently. In other embodiments, only some of the bulbs 20 move jointly in arrays or independently (e.g., some of the bulbs 20 remain stationary). In certain embodiments in which the plurality of radiant heat sources is a plurality of reflectors 22, the reflectors 22 move jointly in arrays. In some embodiments, the reflectors 22 each move independently. In other embodiments, only some of the reflectors 22 move jointly in arrays or independently (e.g., some of the reflectors 22 remain stationary). In certain embodiments in which the plurality of radiant heat sources is either a single reflector plate or a plurality of reflector plates not affixed to a particular bulb 20, the reflector plates may move jointly in arrays or independently. The movements of the lamps 18, bulbs 20, reflectors 22, and reflector plates are provided only as examples, and those in the art will recognize the numerous permutations of oscillating the radiant heat sources in order to blur the edges of the hot or cold spots. For example, the apparatus 10 may comprise a plurality of radiant heat sources in which some bulbs 20 move independently and some reflectors 22 move jointly.

FIG. 2 illustrates an embodiment in which a plurality of radiant heat sources, here comprising bulbs 20, moves in a linearly reciprocating motion. For the sake of illustrating independent movement among the bulbs 20, the center bulb 20 moves in a longer path than the left and right bulbs 20. Further examples of independent motion include motion at different rates, motion with different periods of oscillation, and asynchronous motion of the same distance, rate, and/or period. The left and right bulbs 20 move from a first position 80 to a second position 81 along a linear path (as depicted in FIG. 2), and then return to the first position 80. The center bulb 20 moves from a first position 82 to a second position 83 along a linear path (as depicted in FIG. 2), and then returns to the first position 82. The movement of the bulbs 20 from the second positions 81, 83 to the first positions 80, 82 is along the same linear path as the movement from the first positions 80, 82 to the second positions 81, 83. The duration for traveling along the paths from the first positions 80, 82 to the second positions 81, 83 may vary based on path length, motor speed, and the like. In embodiments comprising independent movement, the period of oscillation can be the same for each radiant heat source where the rate of movement of the radiant heat sources that are on a longer oscillation path (e.g., between first position 82 and second position 83) is faster than the rate of movement of the radiant heat sources that are on a shorter oscillation path (e.g., between first position 80 and second position 81). Preferably, the linear reciprocation is along a plane approximately parallel to the major surface of the workpiece 16. In some embodiments, the linear reciprocation is along a plane about perpendicular to the major surface of the workpiece 16 or along a plane somewhere between parallel to the major surface of the workpiece 16 and perpendicular to the major surface of the workpiece 16. The geometric center of the oscillatory movement is the geometric center of the linear path. Thus, movement from the geometric center is defined by the distance from the center of the linear path.

The less intense areas 30 and the more intense areas 32 move with the radiant heat sources. When the radiant heat sources are moved in an oscillatory motion, the radiant heat sources illuminate different areas of the workpiece 16, thereby moving the less intense areas 30 and the more intense areas 32 to different positions on the workpiece 16. The cumulative intensity-profile moves as well, and may change shape if the radiant heat sources are moved independently. Any portions of the workpiece 16 that are illuminated by the less intense areas 30 for some duration are illuminated by the more intense areas 32 during other durations. These changes in position of the less intense regions 30 and more intense regions 32 smooth out the intensity profile over the period of oscillation, as indicated by the dotted-line intermediate intensity profiles. The smoothing results in more uniform intensity across the workpiece 16, thereby allowing for more uniform processing within the chamber 12. The radiant heat source locations and their corresponding intensity profiles in FIG. 2 are greatly exaggerated for illustration purposes, and it will be appreciated that much slighter movement, many more radiant heat sources, etc. may be appropriate in some applications.

Figure 3:
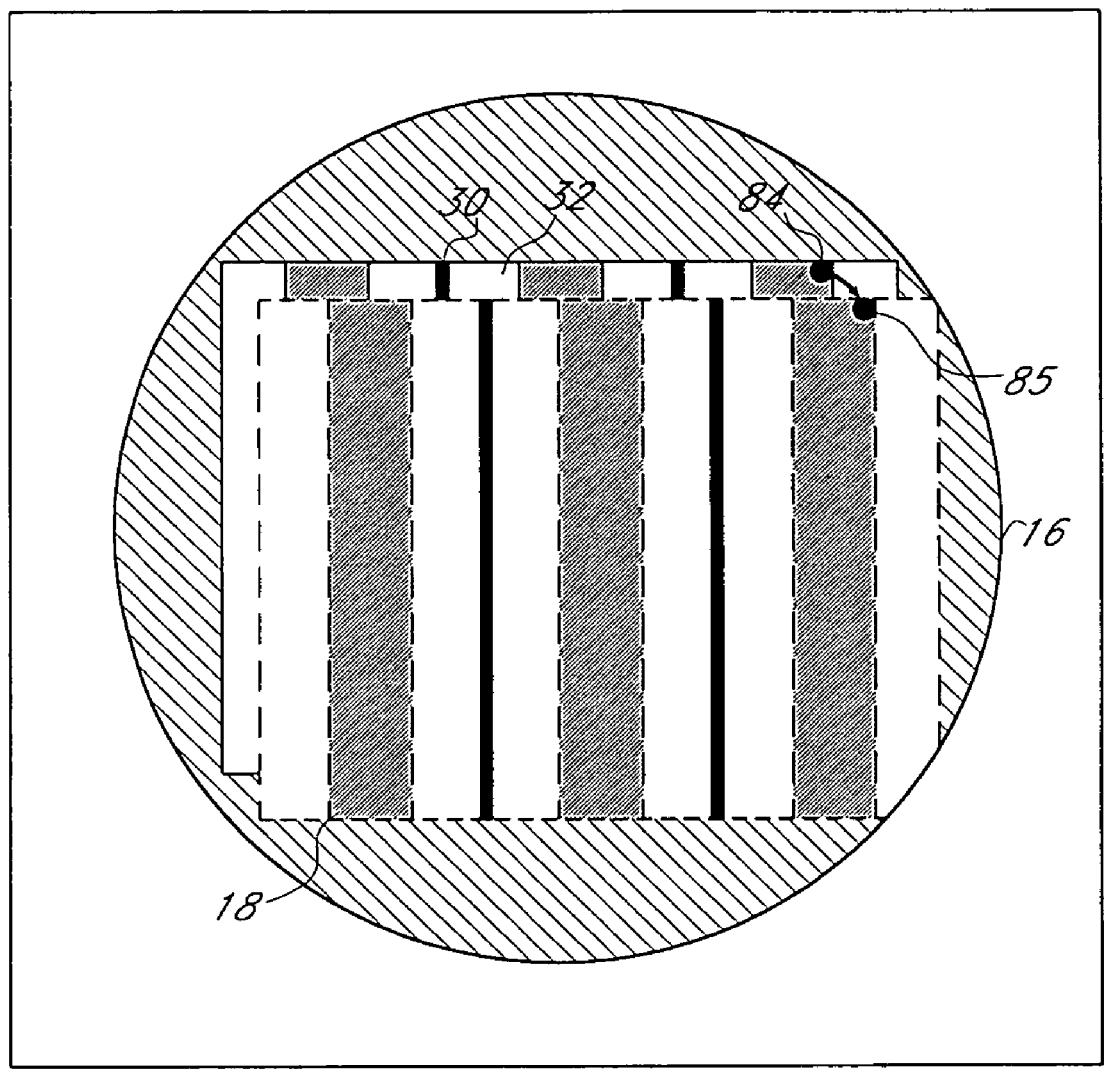
FIG. 3 is a schematic plan view of another embodiment of the motion of the movable radiation device of FIG. 1.

FIG. 3 is a schematic plan view of an embodiment in which the radiant heat sources, here comprising a bank of lamps 18, move in an arcuately reciprocating motion. The radiant heat sources move from a first position 84 to a second position 85 along an arcuate path (as depicted in FIG. 3), and then return to the first position 84. In certain embodiments, the arcuate path is approximately circular. In some embodiments, the arcuate path is approximately elliptical. The geometric center of the oscillatory movement is the geometric center of the arcuate path. The return of the radiant heat sources to the first position 84 is along the same arcuate path as from the first position 84 to the second position 85. As described above, the movement of the plurality of radiant heat sources, and the corresponding movement of the less intense areas 30, smoothes out the overall intensity profile, thereby allowing for more uniform processing within the chamber 12.

As illustrated in FIG. 3, the arcuate reciprocation is along a plane about parallel to the major surface of the workpiece 16. In some embodiments, arcuate reciprocation is along a plane about perpendicular to the major surface of the workpiece 16 (e.g., as depicted in FIGS. 4A and 4B) or along a plane somewhere between parallel to the major surface of the workpiece 16 and perpendicular to the major surface of the workpiece 16. Reciprocation other than solely linear and solely arcuate reciprocation is also possible. For example, the radiant heat sources may move from a first position to a second position in a combination of linear and arcuate paths, returning to the first position along the same combination of linear and arcuate paths.

FIGS. 4A and 4B illustrate an embodiment in which a plurality of radiant heat sources, here comprising a bank of bulbs 20 moving together, moves in an arcuately reciprocating motion in a plane approximately perpendicular to the major surface of the workpiece 16, for example similar to an anchor at the end of a pendulum. The plurality of radiant heat sources swing from a first angular position 86 by $\alpha_1$ degrees to an intermediate angular position 87 (as depicted in FIG. 4A) and then by $\alpha_2$ degrees to a second angular position 88 (as depicted in FIG. 4B) along an arcuate path. The total movement along the arcuate path may be described by the angle $\alpha$, which is the sum of $\alpha_1$ and $\alpha_2$. In certain embodiments, the arcuate path is approximately circular. In some embodiments, the arcuate path is approximately elliptical (e.g., by moving the pivot point of a pendulum during movement of the plurality of radiant heat sources). The geometric center of the oscillatory movement is the geometric center of the arcuate path. The return of the radiant heat source to the first position 86 is along the same arcuate path as from the first position 86 to the second position 88 (e.g., via the intermediate position 87). As described above, the movement of the plurality of radiant heat sources, and the corresponding movement of the more or less intense areas, smoothes out the overall intensity profile, thereby allowing for more uniform processing within the chamber.

Figure 4C:
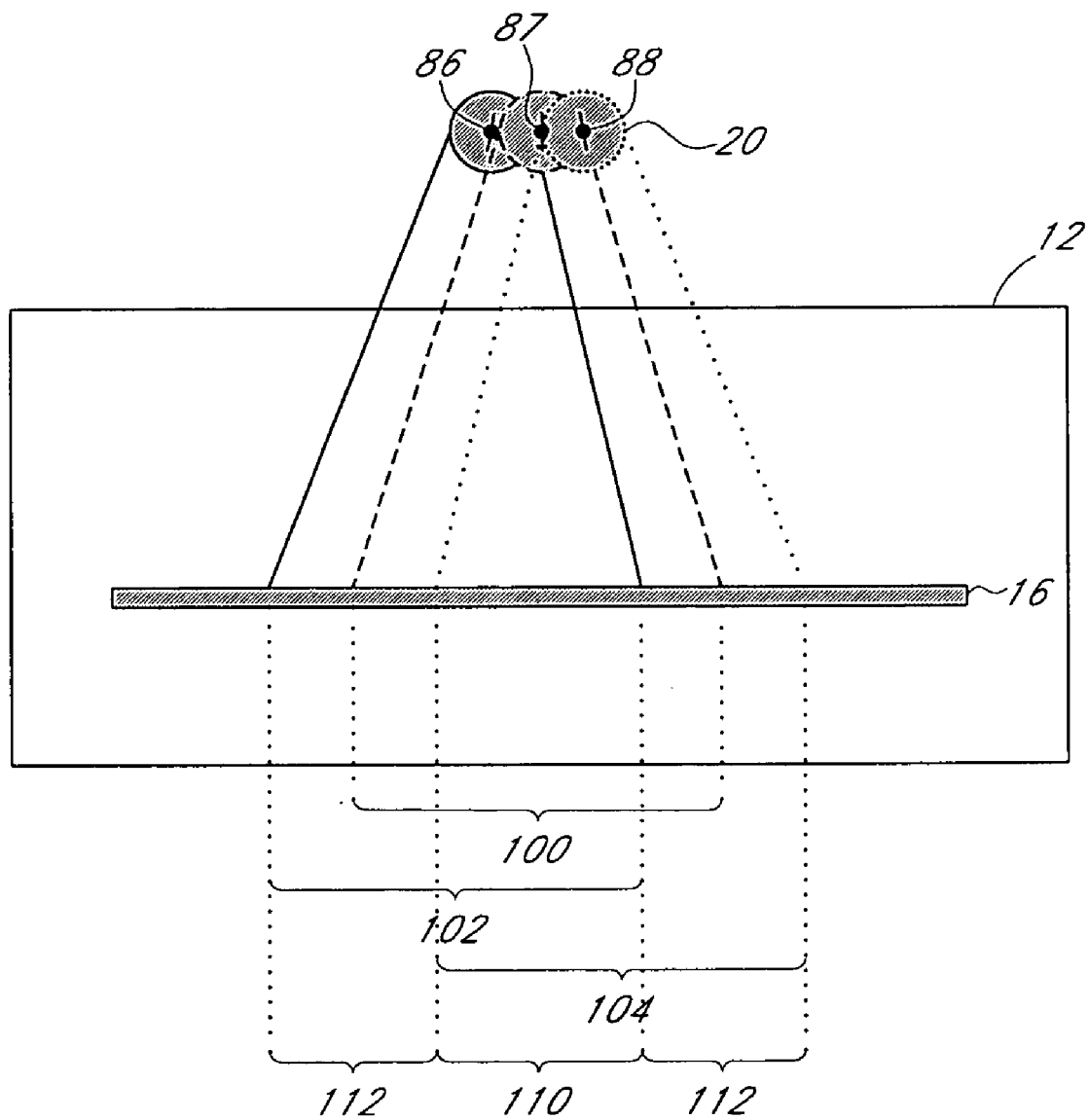

FIG. 4C illustrates the movement of a single radiant heat source when moved from a first position to a second position, for example by linear reciprocation, arcuate oscillation, or any of the movements described herein. The arcuate movement of the center radiant heat source illustrated in FIGS. 4A and 4B is used in FIG. 4C for the sake of illustrating the various positions of a radiant heat source and the resulting effects, but it will be appreciated that other types of movement will result in illumination changes corresponding to that type of movement. In the intermediate position 87, the radiant heat source illuminates an area 100. In the first position 86, the radiant heat source illuminates an area 102. In the second position 88, the radiant heat source illuminates an area 104. A constant illumination area 110 is illuminated in every position of the radiant heat source. Blurred areas 112 are illuminated in some positions of the radiant heat source, but not others. In certain embodiments, the amount of oscillation is defined by the ratio of the blurred areas 112 to the illumination area 100 (or 102, 104), rather than by the difference from a geometric center of the oscillatory motion. In some embodiments, the amount of oscillation is defined by the ratio of the blurred areas 112 to the constant illumination area 110, rather than by the difference from a geometric center of the oscillatory motion. In certain embodiments, the amount of oscillation is defined by the ratio of the blurred areas 112 to the total illumination area (i.e., the sum of the constant illumination area 110 and the blurred areas 112). In some embodiments, any of the previously described ratios is less than about 10%, 5%, 2%, or preferably 1%. The lower limit of the oscillatory motion is greater than 0%. In some embodiments, any of the previously described ratios are preferably between about 1% and 10%, and are more preferably between about 2% and 7%.

Figure 5A:
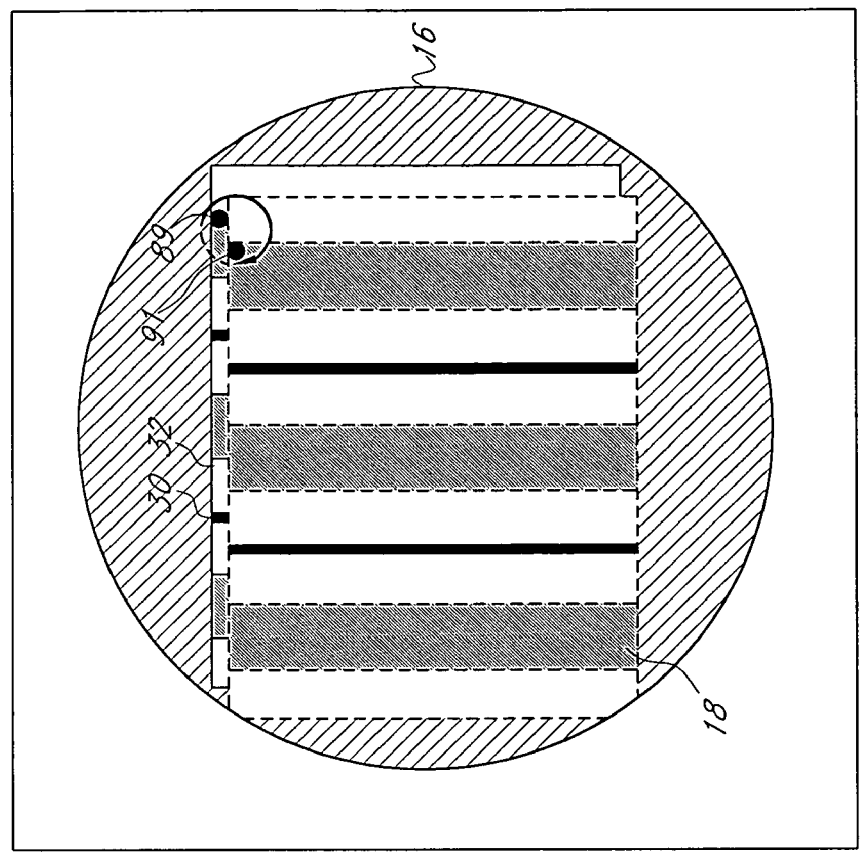
FIGS. 5A through 5C are schematic plan views of still another embodiment of the motion of the movable radiation device of FIG. 1.
Figure 5B:
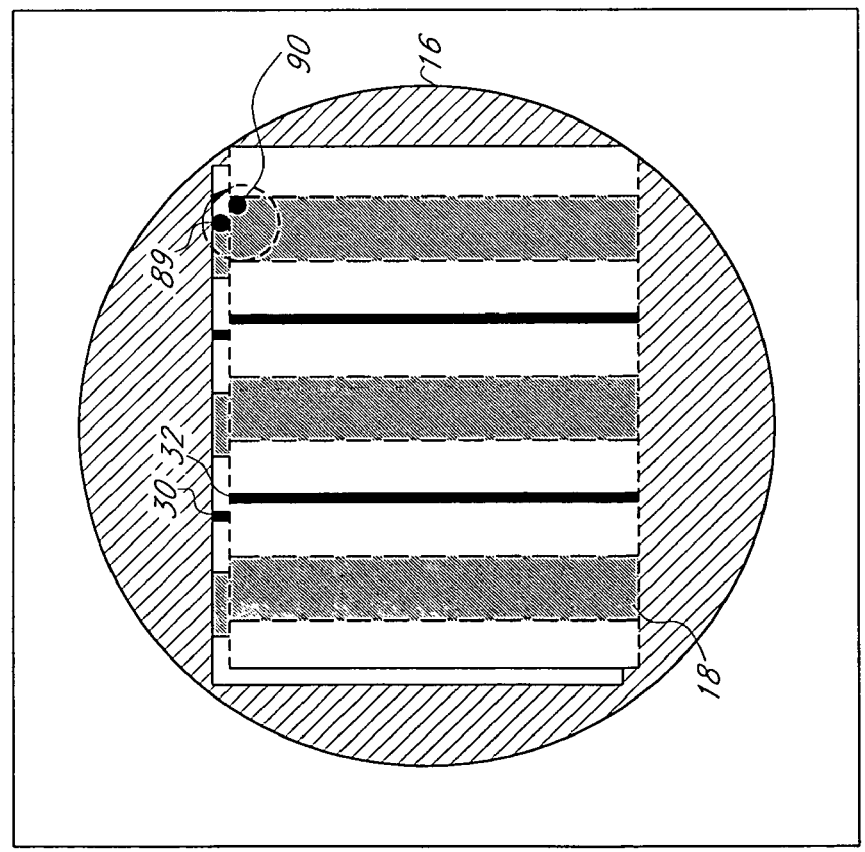
Figure 5C:
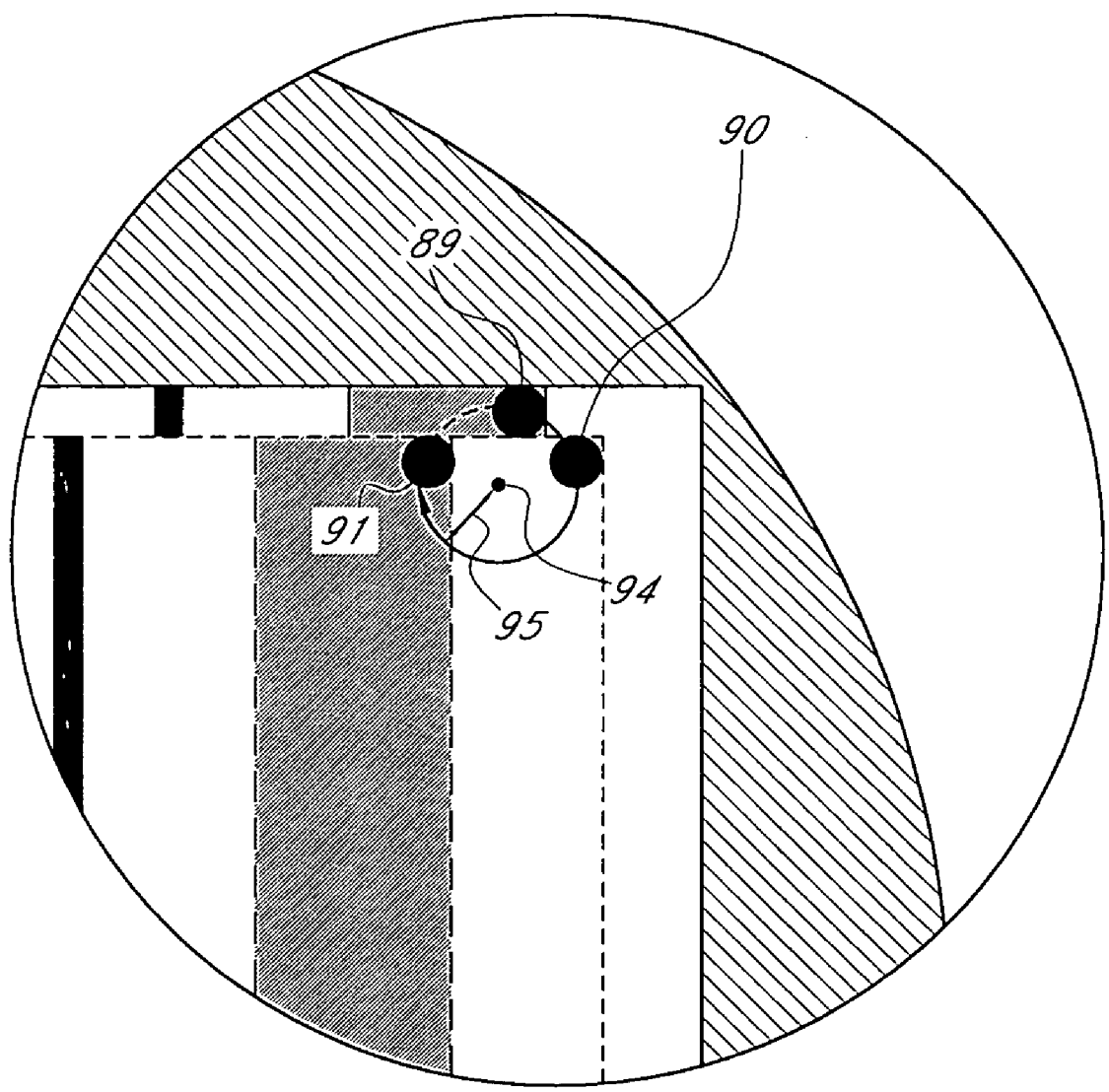

In certain embodiments, the radiant heat sources move in a continuous motion along a closed circuit path that defines a shape. FIGS. 5A through 5C are schematic plan views of an embodiment in which the plurality of radiant heat sources rotate along a circular path within a horizontal plane about parallel to the major surface of the workpiece 16. As depicted in FIG. 5C, the geometric center of the oscillatory movement is the geometric center 94 of the closed circuit path, in this case the circular path. Thus, the extent of the movement about the geometric center 94 is defined by the distance 95 from the center 94 of the circular path. Preferably, the distance 95 of the path from the geometric center 94 (i.e., the radius of the illustrated circular path) is less than about 10 mm, more preferably less than about 5 mm. The radiant heat sources move from a first position 89 to a second position 90 along a circular path (as depicted in FIG. 5A), and then return to the first position 89 in a path different from the path from the path from the first position 89 to the second position 90, for example through a third position 91 (as depicted in FIG. 5B). The first position 89, second position 90, and third position 91, together with the non-illustrated positions therebetween, form a circle in the illustrated embodiment. In some embodiments, the closed-circuit path is elliptical. Closed path shapes or circuits that are not round, such as triangular, square, rectangular, and other polygonal shapes are also possible, as are other combinations of arcuate and linear paths forming a closed shape, for example a hemisphere. In certain embodiments, the closed-circuit path includes changes in vertical height, for example when the path lies in a vertical plane. As described above, the movement of the plurality of radiant heat sources, and the corresponding movement of the less intense areas, smoothes out the overall intensity profile, thereby allowing for more uniform processing within the chamber.

Figure 6:
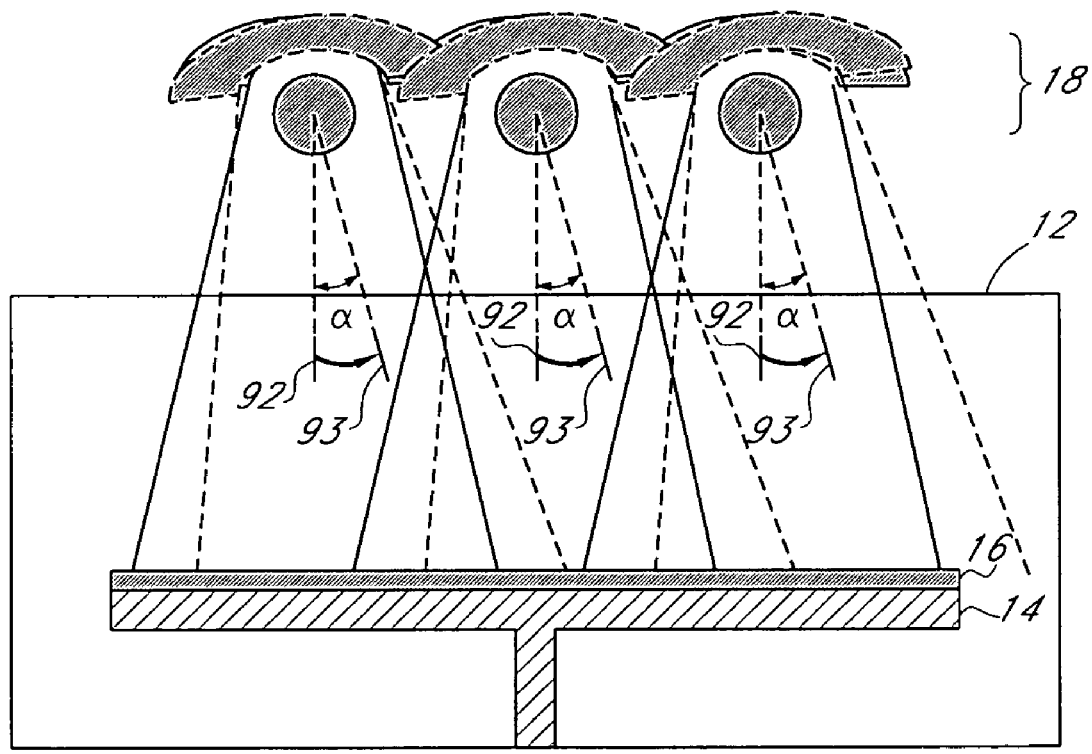
FIG. 6 is a schematic side view of yet still another embodiment of the motion of the movable radiation device of FIG. 1.

FIG. 6 illustrates an embodiment in which the plurality of radiant heat sources, which may comprises any of lamps 18, tubular bulbs 20, and reflectors 22, each having a longitudinal axis defined by the tubular portion of the bulb 20, are oscillated by longitudinally reciprocating the reflectors 22 of each lamp 18 about the longitudinal axis of its tubular bulb 20. In FIG. 6, the angular positioning of the reflectors 22 is depicted by reference light rays 92, 93 propagating from the lamps 18. The reflectors 22 move or pivot from a first angular position 92 to a second angular position 93 along an arcuate path (as depicted in FIG. 6), and then return to the first angular position 92. As described above, the movement of plurality of radiant heat sources, and the corresponding movement of the more and less intense areas, smoothes out the overall intensity profile, thereby allowing for more uniform processing within the chamber 12.

In embodiments in which the plurality of radiant heat sources comprises a plurality of tubular bulbs 20 and a single reflector plate, the plurality of radiant heat sources are oscillated by longitudinally reciprocating the reflector plate about a longitudinal axis defined by the tubular portion a single bulb 20, which is preferably proximate to the center of the plurality of radiant heat sources. As described above, the movement of plurality of radiant heat sources, and the corresponding movement of the more and less intense areas, smoothes out the overall intensity profile, thereby allowing for more uniform processing within the chamber 12.

In the embodiment illustrated in FIG. 6, the angle between the first angular position 92 and the second angular position 93 is represented by the angle of reciprocation α. The angle of reciprocation α could result from swinging the plurality of radiant heat sources along an arcuate path (e.g., as depicted in FIGS. 4A and 4B) or from pivoting the radiant heat sources about a pivot point on the radiant heat sources (e.g., about a longitudinal axis defined by a tubular bulb 20 as depicted in FIG. 6). In some embodiments, the angle of reciprocation α about to the longitudinal axis is less than about 10°. In some embodiments, the angle of reciprocation α about to the longitudinal axis is less than about 5°. The lower limit of the oscillatory motion is greater than zero degrees. The angle of reciprocation α about to the longitudinal axis is preferably between about 1° and 5°, and is more preferably between about 1° and 3°. Preferably, the amount of angular reciprocation or pivoting in such embodiments is defined with reference to the ratios of illuminated areas 100, 102, 104, constantly illuminated area 110, and/or the blurred areas 112, as described above.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while several variations have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention (e.g., all above-noted types of oscillation are possible for lamps, bulbs, or reflectors, and are possible for individual radiant heat sources and arrays of radiant heat sources). It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. A semiconductor processing apparatus comprising:
   a processing chamber; and
   a plurality of radiant heat sources to heat a workpiece within the chamber, wherein at least one of the radiant heat sources is movable during processing in an oscillatory motion along a path less than about 10 mm from a geometric center of the oscillatory motion.

2. The apparatus of claim 1, wherein at least one of the radiant heat sources is movable during processing in an oscillatory motion along a path less than about 5 mm from the geometric center of the oscillatory motion.

3. The apparatus of claim 1, further comprising:
   at least one motor coupled to at least one of the radiant heat sources; and
   a controller for directing the movement of the at least one motor.

4. The apparatus of claim 1, wherein at least one of the radiant heat sources is a reflector.

5. The apparatus of claim 1, wherein at least one of the radiant heat sources comprises a bulb and a reflector, the reflector disposed on a side of the bulb substantially opposite the workpiece.

6. The apparatus of claim 1, wherein at least one of the radiant heat sources comprises a plurality of bulbs and a reflector plate, the reflector plate disposed on a side of the plurality of bulbs substantially opposite the workpiece.

7. The apparatus of claim 1, wherein the radiant heat sources are independently movable.

8. The apparatus of claim 1, wherein the radiant heat sources comprise at least one jointly movable array of radiant heat sources.

9. The apparatus of claim 8, wherein the at least one jointly movable array spans a susceptor within the chamber such that the array is capable of irradiating the entire surface of the workpiece supported on the susceptor.

10. The apparatus of claim 1, wherein the oscillatory motion comprises reciprocation and the geometric center is the halfway point along the path.

11. The apparatus of claim 10, wherein the reciprocation comprises linear reciprocation.

12. The apparatus of claim 10, wherein the oscillatory motion comprises arcuate reciprocation.

13. The apparatus of claim 12, wherein the arcuate reciprocation comprises reciprocation about a circular arcuate path.

14. The apparatus of claim 12, wherein the arcuate reciprocation comprises reciprocation about an elliptical arcuate path.

15. The apparatus of claim 1, wherein the path is a closed circuit and the geometric center is the center of a shape defined by the path.

16. The apparatus of claim 15, wherein the motion comprises rotation along a circular path.

17. The apparatus of claim 15, wherein the motion comprises rotation along an elliptical path.

18. The apparatus of claim 15, wherein the motion comprises rotation along a polygonal path.

19. The apparatus of claim 1, wherein the plurality of radiant heat sources comprises a plurality of tubular lamps, the lamps including a bulb and a reflector, the reflector disposed on the side of the bulb substantially opposite the workpiece, the tubular portion of each bulb defining a longitudinal axis, and wherein the oscillatory motion comprises reciprocating at least one of the reflectors about the longitudinal axis.

20. The apparatus of claim 19, wherein reciprocating comprises moving the at least one of the reflectors through an angle of less than about 10° along the longitudinal axis.

21. The apparatus of claim 20, wherein the angle is less than about 5°.

22. The apparatus of claim 20, wherein the angle is between about 1° and 5°.

23. The apparatus of claim 20, wherein the angle is between about 1° and 3°.

24. The apparatus of claim 1, wherein the plurality of radiant heat sources comprises a plurality of tubular bulbs and a reflector plate, the reflector plate disposed on the side of the bulbs substantially opposite the workpiece, the tubular portion of one bulb defining a longitudinal axis, and wherein the oscillatory motion comprises reciprocating the reflector plate about the longitudinal axis.

25. The apparatus of claim 24, wherein reciprocating comprises moving the reflector plate through an angle of less than about 10° along the longitudinal axis.

26. The apparatus of claim 25, wherein the angle is less than about 5°.

27. The apparatus of claim 25, wherein the angle is between about 1° and 5°.

28. The apparatus of claim 25, wherein the angle is between about 1° and 3°.

29. A semiconductor processing apparatus comprising:
a processing chamber; and
a plurality of radiant heat sources to illuminate a first area on a workpiece within the chamber, wherein at least one of the radiant heat sources is movable in a motion during processing from a first angular position to a second angular position to illuminate a second area on the workpiece, a ratio of the second area to the first area less than about 10%.

30. The apparatus of claim 29, wherein the ratio is less than about 5%.

31. The apparatus of claim 29, wherein the motion comprises a pivoting motion.

32. The apparatus of claim 29, wherein the motion comprises a swinging motion.

* * * * *